US009099182B1

(12) United States Patent
Montierth et al.

(10) Patent No.: US 9,099,182 B1
(45) Date of Patent: Aug. 4, 2015

(54) METHOD AND APPARATUS FOR SELECTIVE USE OF WEAR-LEVELING TO STORE DATA IN A MEMORY

(71) Applicant: Marvell International Ltd., Hamilton (BM)

(72) Inventors: Mark D. Montierth, Meridian, ID (US); Randall D. Briggs, Boise, ID (US); Douglas G. Keithley, Boise, ID (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/278,932

(22) Filed: May 15, 2014

Related U.S. Application Data

(63) Continuation of application No. 13/888,119, filed on May 6, 2013, now Pat. No. 8,743,609, which is a continuation of application No. 13/397,504, filed on Feb. 15, 2012, now Pat. No. 8,437,189, which is a continuation of application No. 13/207,277, filed on Aug. 10, 2011, now Pat. No. 8,120,969, which is a continuation of application No. 12/772,819, filed on May 3, 2010, now Pat. No. 8,000,142, which is a continuation of application No. 11/957,269, filed on Dec. 14, 2007, now Pat. No. 7,710,777.

(60) Provisional application No. 60/871,022, filed on Dec. 20, 2006.

(51) Int. Cl.
*G06F 13/00* (2006.01)
*G11C 16/10* (2006.01)
*G11C 16/06* (2006.01)

(52) U.S. Cl.
CPC ............. *G11C 16/10* (2013.01); *G11C 16/06* (2013.01)

(58) Field of Classification Search
CPC ................................ G11C 16/16; G06F 13/00
USPC ...................................................... 365/185.09
See application file for complete search history.

(56) References Cited

U.S. PATENT DOCUMENTS

| 5,263,003 | A | 11/1993 | Cowles et al. |
| 5,479,638 | A | 12/1995 | Assar et al. |
| 5,530,828 | A | 6/1996 | Kaki et al. |
| 5,815,441 | A | 9/1998 | Kobatake |
| 6,000,006 | A | 12/1999 | Bruce et al. |
| 6,081,447 | A | 6/2000 | Lofgren et al. |
| 6,131,139 | A | 10/2000 | Kikuchi et al. |
| 6,230,233 | B1 | 5/2001 | Lofgren et al. |
| 6,732,221 | B2 | 5/2004 | Ban |
| 6,751,155 | B2 | 6/2004 | Gorobets |
| 6,831,865 | B2 | 12/2004 | Chang et al. |
| 6,898,662 | B2 | 5/2005 | Gorobets |
| 7,002,851 | B2 | 2/2006 | Yamagami et al. |
| 7,006,386 | B2 | 2/2006 | Yamagami et al. |
| 7,035,967 | B2 * | 4/2006 | Chang et al. ............ 711/103 |
| 7,064,995 | B2 | 6/2006 | Yamagami et al. |
| 7,120,729 | B2 | 10/2006 | Gonzalez et al. |
| 7,158,411 | B2 | 1/2007 | Yeh et al. |
| 7,269,708 | B2 | 9/2007 | Ware |
| 7,287,118 | B2 | 10/2007 | Chang et al. |
| 7,366,034 | B2 | 4/2008 | Kozakai et al. |
| 7,369,438 | B2 | 5/2008 | Lee |

(Continued)

*Primary Examiner* — Son Mai

(57) ABSTRACT

Semi-volatile NAND flash memory systems, apparatuses, and methods for use are described herein. According to various embodiments, a semi-volatile NAND flash memory may be partitioned into various retention regions. Other embodiments may be described and claimed.

20 Claims, 4 Drawing Sheets

(56) References Cited

U.S. PATENT DOCUMENTS

| | | |
|---|---|---|
| 7,441,067 B2 | 10/2008 | Gorobets et al. |
| 7,475,184 B2 | 1/2009 | Lee |
| 7,489,562 B2 | 2/2009 | Maayan et al. |
| 2004/0080985 A1 | 4/2004 | Chang et al. |
| 2008/0140918 A1* | 6/2008 | Sutardja ........................ 711/103 |
| 2008/0279005 A1 | 11/2008 | France |
| 2009/0122949 A1* | 5/2009 | Reid et al. ................. 365/230.01 |
| 2009/0172255 A1 | 7/2009 | Yeh et al. |
| 2010/0064096 A1 | 3/2010 | Weingarten et al. |
| 2010/0318719 A1 | 12/2010 | Keays et al. |
| 2012/0117304 A1 | 5/2012 | Worthington et al. |

\* cited by examiner

METHOD AND APPARATUS FOR SELECTIVE USE OF WEAR-LEVELING TO STORE DATA IN A MEMORY

CROSS REFERENCE TO RELATED APPLICATIONS

The present disclosure is a continuation of and claims priority to U.S. patent application Ser. No. 13/888,119, filed May 6, 2013, now U.S. Pat. No. 8,743,609, issued Jun. 3, 2014, which is a continuation of and claims priority to U.S. patent application Ser. No. 13/397,504, filed Feb. 15, 2012, now U.S. Pat. No. 8,437,189, issued May 7, 2013, which is a continuation of U.S. patent application Ser. No. 13/207,277, filed Aug. 10, 2011, now U.S. Pat. No. 8,120,969, issued Feb. 21, 2012, which is a continuation of U.S. patent application Ser. No. 12/772,819, filed May 3, 2010, now U.S. Pat. No. 8,000,142, issued Aug. 16, 2011, which is a continuation of U.S. patent application Ser. No. 11/957,269, filed Dec. 14, 2007, now U.S. Pat. No. 7,710,777, issued May 4, 2010, which claims priority to U.S. Provisional Patent Application No. 60/871,022, filed Dec. 20, 2006, which are incorporated herein by reference.

TECHNICAL FIELD

Embodiments of the present invention relate to the field of memory devices, and in particular, to semi-volatile NAND flash memory.

BACKGROUND

Increases in technology and consumer desire for increased functionality in electronic systems have generated a need for increasing amounts of memory. As the amount of memory in electronic assemblies grows, however, the costs of the electronic assemblies also increase, with a larger percentage of that cost accountable to that of the additional memory.

Typically, within electronic systems, two types of memory are utilized: volatile memory and non-volatile memory. Volatile memory may include Dynamic Random Access Memory ("DRAM") or Static Random Access Memory ("SRAM"), while non-volatile memory may include Read Only Memory ("ROM"), flash, One Time Programmable memory ("OTP"), or Electrically Erasable Programmable Read-Only Memory ("EEPROM").

The decision to store data in volatile or non-volatile memory is generally driven by the characteristics associated with each type of memory. For instance, non-volatile flash memory has the ability to retain data while power is removed from the memory device, but suffers from a slower access speed relative to volatile memory devices. Additionally, in some instances, non-volatile flash memory may have a maximum number of write cycles it may perform prior to experiencing "wear-out." Wear-out means the device loses or experiences a diminished capacity to store data. Such characteristics make non-volatile memory well suited for storing information and data which is needed for the life of the electronic system, for example, firmware and programs.

Volatile memory, on the other hand, with its more durable and faster write cycles is typically used for buffering incoming I/O data, storing processed data, and implementing the processor stack. Volatile memory, however, may have as much as a 4-to-1 cost per bit increase over non-volatile memory counterparts. Unfortunately, the characteristics of both volatile and non-volatile memory, of which a few are mentioned above, have kept non-volatile memory such as NAND flash memory from becoming a viable alternative to the more expensive volatile memory types.

Increases in non-volatile memory within a device may still provide additional benefits. For example, storage for demonstration pages for various printing devices and storage of device drivers for electronic systems.

Therefore, it is desirable to find a way to add additional memory without adding additional cost or to maintain current memory capacity while reducing cost, in addition to utilizing the additional or current non-volatile memory capacity as an alternative to volatile memory.

SUMMARY

In view of the challenges in the state of the art, at least some of the embodiments of the present invention are based on the technical problem of providing a more advantageous memory device by way of novel methods to employ NAND flash memory in roles reserved for volatile memory. More specifically, there is provided, in accordance with various embodiments of the present invention, a method comprising partitioning a NAND flash memory cell array into a first retention region and a second retention region; and storing transient data in the second retention region.

In some embodiments, the method may include storing retained data in the first retention region.

In some embodiments, the method may include partitioning the NAND flash memory cell array into a third retention region; and storing temporary data in the third retention region.

In some embodiments, the method may include performing wear-leveling on at least one of the first retention region, the second retention region, and the third retention region.

In some embodiments, the method may include refreshing at least one of the transient data in the second retention region, and the temporary data in the third retention region after a predetermined amount of write cycles.

In some embodiments, the method may include repeating the refreshing after a predetermined amount of time.

In some embodiments, the method may include a first retention region, a second retention region, and a third retention region that are not equivalent in size.

An article of manufacture may also be provided in accordance with various embodiments of the present invention. The article of manufacture may include a computer readable medium; a plurality of programming instructions stored on the computer readable medium and designed to enable a device to partition a NAND flash memory cell array into a first retention region, and a second retention region; and store transient data in the second retention region.

In some embodiments the programming instructions may be further designed to enable the device to store retained data in the first retention region.

In some embodiments the programming instructions may be further designed to enable the device to partition the NAND flash memory cell array into a third retention region; and store temporary data in the third retention region.

In some embodiments the programming instructions may be further designed to enable the device to refresh at least one of the transient data in the second retention region, and the temporary data in the third retention region after a predetermined amount of write cycles.

In some embodiments the programming instructions may be further designed to enable the device to repeat the refresh after a predetermined amount of time.

In some embodiments the programming instructions may be further designed to enable the device to partition the NAND flash memory cell array into first, second, and third retention regions of different sizes.

A semi-volatile NAND flash system may also be provided in accordance with various embodiments of the present invention. The semi-volatile NAND flash system may include a NAND flash memory cell array partitioned into a plurality of retention regions including a first retention region and a second retention region; and a memory controller configured to selectively store data into one of the plurality of retention regions based on an expected storage duration associated with the data; wherein the first retention region is configured to store data having an expected storage duration that is equal to or less than a first threshold; and wherein the second retention region is configured to store data having an expected storage duration that is equal to or less than a second threshold, the first threshold being greater than the second threshold.

In some embodiments, the semi-volatile NAND flash system may include a memory controller further configured to store retained data in the first retention region.

In some embodiments, the semi-volatile NAND flash system may include a plurality of retention regions including a third retention region, wherein the third retention region is configured to store data having an expected storage duration that is equal to or less than a third threshold; the second threshold being greater than the third threshold.

In some embodiments, the semi-volatile NAND flash system may include a memory controller further configured to refresh at least one of the transient data in the second retention region and the temporary data in the third retention region after a predetermined amount of write cycles.

In some embodiments, the semi-volatile NAND flash system may include a memory controller further configured to repeat the refresh after a predetermined amount of time.

In some embodiments, the semi-volatile NAND flash system may include first, second, and third retention regions having different sizes.

In some embodiments, the semi-volatile NAND flash system may include a memory controller further configured to perform wear-leveling on at least one of the first retention region, the second retention region, and the third retention region.

A semi-volatile NAND flash apparatus may also be provided, the apparatus comprising a first retention region; and a second retention region, wherein the second retention region is configured to store transient data.

In some embodiments, the first retention region may be configured to store retained data.

In some embodiments, the semi-volatile NAND flash apparatus may include a third retention region, wherein the third retention region is configured to store temporary data.

In some embodiments, at least one of the transient data in the second retention region, and the temporary data in the third retention region is refreshed after a predetermined amount of write cycles.

In some embodiments, at least one of the transient data in the second retention region, and the temporary data in the third retention region is periodically refreshed after a predetermined amount of time.

In some embodiments, the first retention region, the second retention region, and the third retention region may have different memory capacities.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

DETAILED DESCRIPTION

Figure 1:
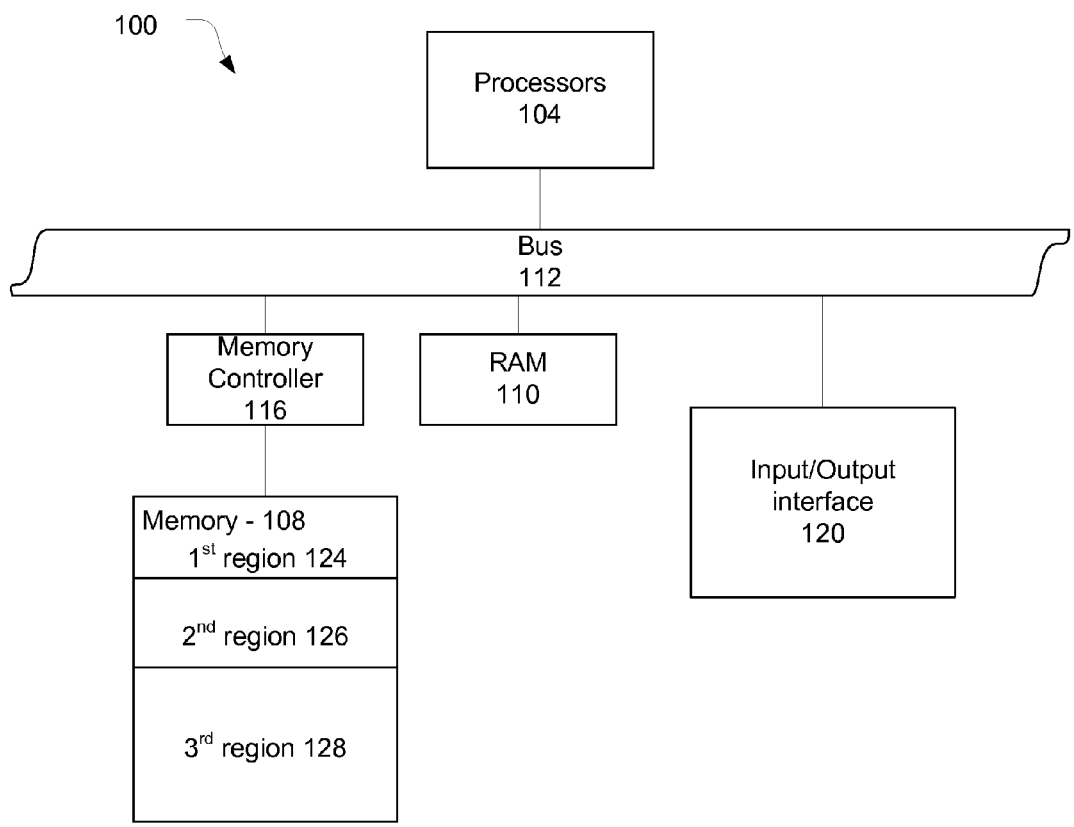
FIG. 1 is a block diagram of a general host system which includes an embodiment of the present invention.

In the following detailed description, reference is made to the accompanying drawings which form a part hereof, and in which are shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)".

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

NAND flash memory is substantially cheaper per bit than volatile memory substitutes, such as DRAM. NAND flash memory, however, has well known limitations which have kept it from becoming a viable substitute for DRAM. One such limitation is that it is has a maximum number of write cycles allowed to its memory cells. Prior art contains various solutions attempting to minimize this limitation. One solution is referred to as "wear-leveling." Wear-leveling refers to tracking how many times a particular memory block has been written and/or erased, and once a block has significantly more writes than other blocks in the same region, utilizing a new block in its place. While this method may prolong the life of the NAND flash memory, it fails to address its finite number of write cycles.

Semi-volatile NAND flash memory, in accordance with various embodiments of the present invention, addresses the limitations of NAND flash memory by partitioning the memory cells into distinct regions. One aspect of the invention is that additional writes beyond the memory device's rating do not destroy its functionality, but merely reduce its retention time. For example, a NAND flash memory device may have a fixed wear-out metric, referred to as "endurance." This may refer to a memory device's rating, e.g., the ability to retain data for at least ten years at a maximum of 100,000 erase/program cycles. This memory device does not cease functioning with further write cycles beyond 100,000. Rather, due to degradation, the device may only retain data for a shorter amount of time, for example, one year. This failure mechanism may be extended to a cell that has been through possibly millions of write cycles, at which time it may have degraded to a point where it retains data for much shorter time periods, for example, an hour.

By segregating the memory cells into regions, storage based upon estimated retention times may effectively negate the known limitations of NAND flash memory, thereby making it a viable alternative to more expensive volatile memory modules such as DRAM. Data which is stored for short periods of time may be stored in a region of the semi-volatile NAND flash which has experienced write cycles beyond the part's rating. This not only accomplishes the storage of the data for the necessary short period of time, but also effectively alleviates unnecessary write cycles to other regions in which long term storage may be needed.

In various embodiments of the present invention, methods, and systems for using semi-volatile NAND flash memory in electronic assemblies are provided. In this manner, increased functionality, and consequently a more competitive electronic device, may be attained while at a reduced or equivalent cost.

FIG. 1 illustrates a host system or computing device 100 capable of incorporating a semi-volatile NAND flash memory 108, in accordance with various embodiments of the present invention. As illustrated, the computing device 100 generally includes a system bus 112 which allows processors 104, random access memory 110 (RAM), one or more input/output interfaces 120 to communicate. It should be appreciated that the computing device 100 may generally include other components, e.g., display devices and networking devices, which are not shown for purposes of illustration.

In various embodiments, semi-volatile NAND flash memory 108 may be arranged to interface with system bus 112 through a memory controller 116. The semi-volatile NAND flash memory 108 may be a removable semi-volatile NAND flash memory device, or alternatively, may be included in the hardware as an irremovable memory device. Semi-volatile NAND flash memory 108 may be implemented on a single chip or a die. Alternatively, semi-volatile NAND flash memory 108 may be implemented on a multi-chip module, or on multiple discrete components which may form a chip set and may be used together as semi-volatile NAND flash memory 108. In other embodiments, computing device 100 may be implemented on a single chip in a single package.

Semi-volatile NAND flash memory 108 may be arranged to store data such that the data may be read and accessed as needed. Data stored in memory device 108 may be written and erased as appropriate. Furthermore, memory controller 116 may be incorporated into semi-volatile NAND flash memory 108 as a single chip, or in other embodiments as a separate component capable of exerting control over memory device 108. Memory controller 116 may generally control the processes of partitioning memory 108, storing data, reading data, and erasing data. Additionally, memory controller 116 may classify data to be stored as either transient data, temporary data, or retained data. In various other embodiments, the classification of data may be accomplished through the use of other components such as processors 104, or communicated from external devices through I/O interface 120.

In various embodiments, semi-volatile NAND flash memory 108 may be partitioned into two or more retention regions. As illustrated in FIG. 1, semi-volatile NAND flash memory 108 is partitioned in first 124, second 126, and third 128 retention regions. Partitioning may be controlled by memory controller 116, or in other embodiments, by other components capable of communication via system bus 112. Partitioning of semi-volatile NAND flash memory 108 into three retention regions may include partitioning semi-volatile NAND flash memory 108 into three retention regions of various sizes, e.g., having different memory capacities. Partitioned regions 124, 126, and 128, may be partitioned based on expected or estimated data retention requirements. Memory controller 116 may also serve to refresh data stored in various retention regions, as will be discussed herein, with reference to FIG. 4, in more detail.

Figure 2:
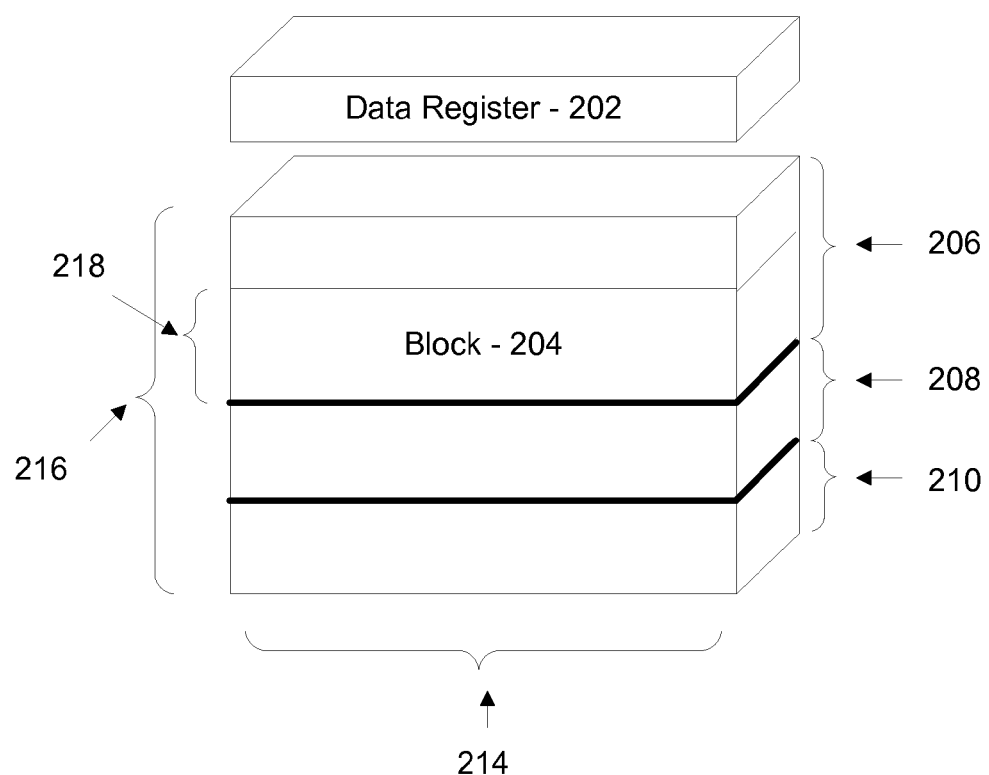
FIG. 2 is a block diagram of a memory device in accordance with various embodiments of the present invention.

Referring to FIG. 2, semi-volatile NAND flash memory device 108 will be described in more detail in accordance with various embodiments of the present invention. Semi-volatile NAND flash memory device 108 may include semi-volatile NAND flash memory cells adapted to retain bits of data by storing one of two or more levels of charge on storage elements such as floating gates (not illustrated). Semi-volatile NAND flash memory cells may be arranged into semi-volatile NAND flash memory pages containing any number of semi-volatile NAND flash memory cells. Additionally, the semi-volatile NAND flash memory pages may arranged into semi-volatile NAND flash memory blocks. In various embodiments, a memory block may be the finest granularity upon which wear-leveling may be performed, and the finest granularity that may be erased in an erase/program cycle.

Referring to FIG. 2, semi-volatile NAND flash memory device 108 may comprise numerous semi-volatile NAND flash memory blocks 204. Semi-volatile NAND flash memory block 204 may comprise any number of semi-volatile NAND flash memory pages 218. The semi-volatile NAND flash memory pages 218, being a subset of semi-volatile NAND flash memory pages 216. Semi-volatile NAND flash memory pages 216 may comprise any number of semi-volatile NAND flash memory cells 214. As an example, semi-volatile NAND flash device 108 may contain 8,192 semi-volatile NAND flash memory blocks 204, each block made up of 32 semi-volatile NAND flash memory pages 218. The 32 semi-volatile NAND flash memory pages 218 being a subset of all the semi-volatile NAND flash memory pages 216. Semi-volatile NAND flash memory pages 218 and 216, may each contain 528 bytes of semi-volatile NAND flash memory cells 214. In the example embodiment, this organization may result in a 1 Gigabit semi-volatile NAND flash device 108. The example embodiment has been provided for illustrative purposes and ease of understanding. It is to be understood that this disclosure is not so limited and may utilize various other memory organization schemes. In various embodiments, semi-volatile NAND flash memory device 108 may incorporate memory controller 116 as an integral part of the semi-volatile NAND flash memory device 108. Additionally, semi-volatile NAND flash memory device 108 may include a data register 202 as is known in the art.

Semi-volatile NAND flash memory device 108 may be partitioned into two or more retention regions. As illustrated, semi-volatile NAND flash memory device 108 is partitioned into a first retention region 206, a second retention region 208, and a third retention region 210. While FIG. 2 illustrates the partitions as horizontal lines, it will be appreciated that such partitions may take any form, and may be determined for optimization of the semi-volatile NAND flash memory device. In one embodiment, partitions may be made based on boundaries of semi-volatile NAND flash memory block 204.

Figure 3:
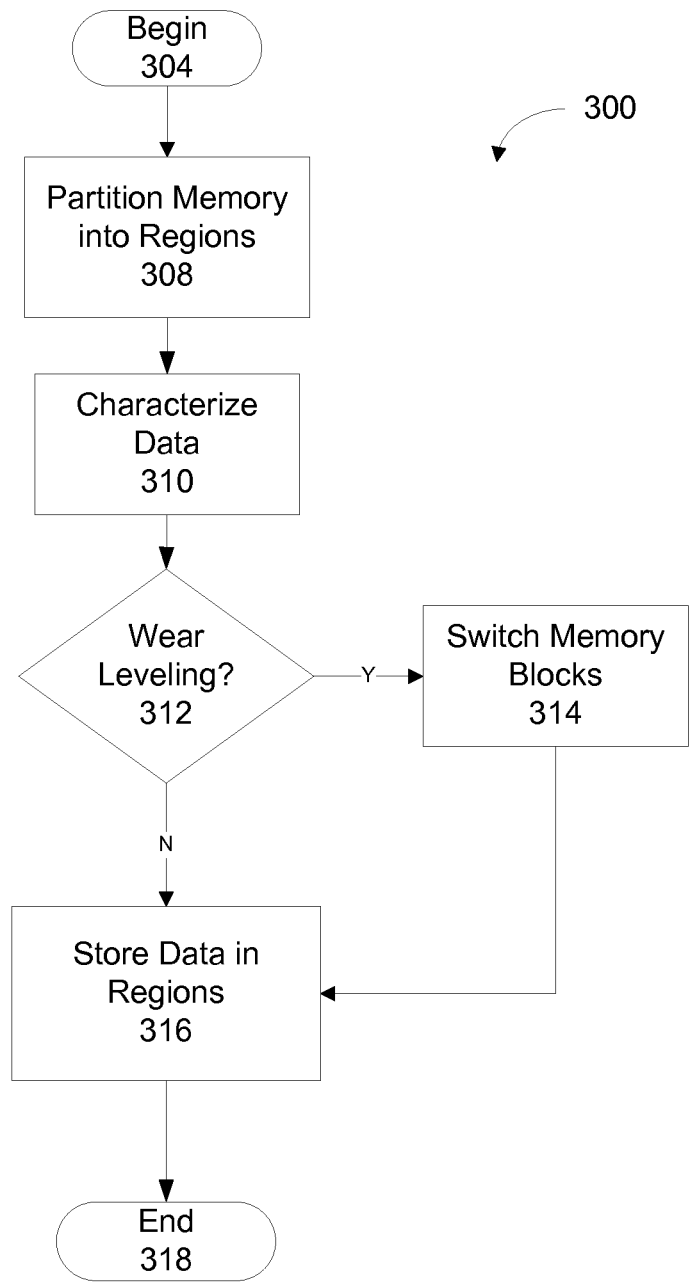
FIG. 3 is a flow diagram illustrating an example method to practice various embodiments of the present invention.

Referring now to FIG. 3, a flow diagram 300 of an example method to practice various embodiments of the present invention is illustrated. The method may begin at block 304 and proceed to block 308 where semi-volatile NAND flash memory is partitioned into retention regions. As mentioned previously, the partitioning may be controlled by a memory controller, or various other components, e.g., processors. The NAND flash memory may be partitioned into two or more regions. In a preferred embodiment, the NAND flash memory is partitioned into three regions, a first retention region, a second retention region, and a third retention region. The amount of memory allocated to each of the regions may depend on the particular application, and may be allocated according to estimated or known memory requirements.

In various embodiments, the first retention region may be characterized as a high retention region used to store data that must be retained for the life of the device. This region may be seldom written to, and therefore, may maintain its ability to store data for prolonged periods of time. "Wear-leveling," as is known in the art, is generally not necessary for this retention region, but may be utilized in certain embodiments. The high retention region may be used to store retained data. Retained data may be characterized as data that is to be retained for the life of the electronic assembly including, but not limited to, firmware code, program code, or network identification information.

In various embodiments, the second retention region may be characterized as a low retention region. As stated previously, write cycles beyond a NAND flash memory cell's rating does not destroy its function, but may impact the cell's ability to retain data for a period of time. For example, a cell which has been written to over a million write cycles may still retain data for a period of time, such as one hour. This may allow for storage of data which is expected to be retained for only a matter of minutes, including but not limited to, print pages to be sent to a printing device, incoming and/or outgoing faxes, and Compact Disk (CD) buffering. Such data may be classified as transient data, and may be expected to be retained for a few minutes or less.

In various embodiments, the third retention region may be characterized as a medium retention region. A medium retention region may be used to store data that must be retained for a period of time while the device may be powered down, for instance radio station button presets for an audio system. The medium retention region may be written to occasionally and may benefit from wear-leveling. In various embodiments, the medium retention region may be utilized to store temporary data. Temporary data may be characterized as data that is to be retained for longer periods of time than transient data, but not necessarily for the life of the device.

Upon partitioning the NAND flash memory cell array, the method may progress to block 310 where data may be characterized as temporary, transient, and/or retained data by a memory controller or other component. In at least one embodiment, a memory controller may characterize the data based on an expected storage duration associated with the data. For example, data may be characterized for a first retention region based on the data having an expected storage duration that is equal to or less than a first threshold, or a second retention region based on the data having an expected storage duration that is equal to or less than a second threshold, the first threshold being greater than the second threshold.

Once the data has been characterized, a decision may be made at block 312 regarding whether to perform wear-leveling on the respective partition of the characterized data. In this manner, wear-leveling may be used as a factor in deciding where to store the data. For example, wear leveling may be utilized to maintain equivalent endurance characteristics for all blocks within a partition. In other embodiments, wear-leveling may comprise marking a block as the last time it should be used, also known in the art as "sparing." It is to be understood that various wear-leveling algorithms may be used, and that the invention is not to be limited in this regard. Wear-leveling may be performed on any of the regions as stated previously. Alternatively, semi-volatile NAND flash memory may be used in a "first in-first out" (FIFO) manner. This may have the effect of utilizing all the memory cells in a consistent and systematic manner, thereby tempering some of the benefits provided by wear-leveling. If wear-leveling is desired, the method may proceed to block 314 where wear-leveling may be performed, and various memory blocks may be selected. The method then continues to block 316 where the characterized data may be stored in its respective region, and subsequently the method may end at block 318. Returning to block 312, if it is determined that wear-leveling is not to be performed, the method may continue to block 316 where the characterized data may be stored in its respective region, and the method may end at block 318.

Figure 4:
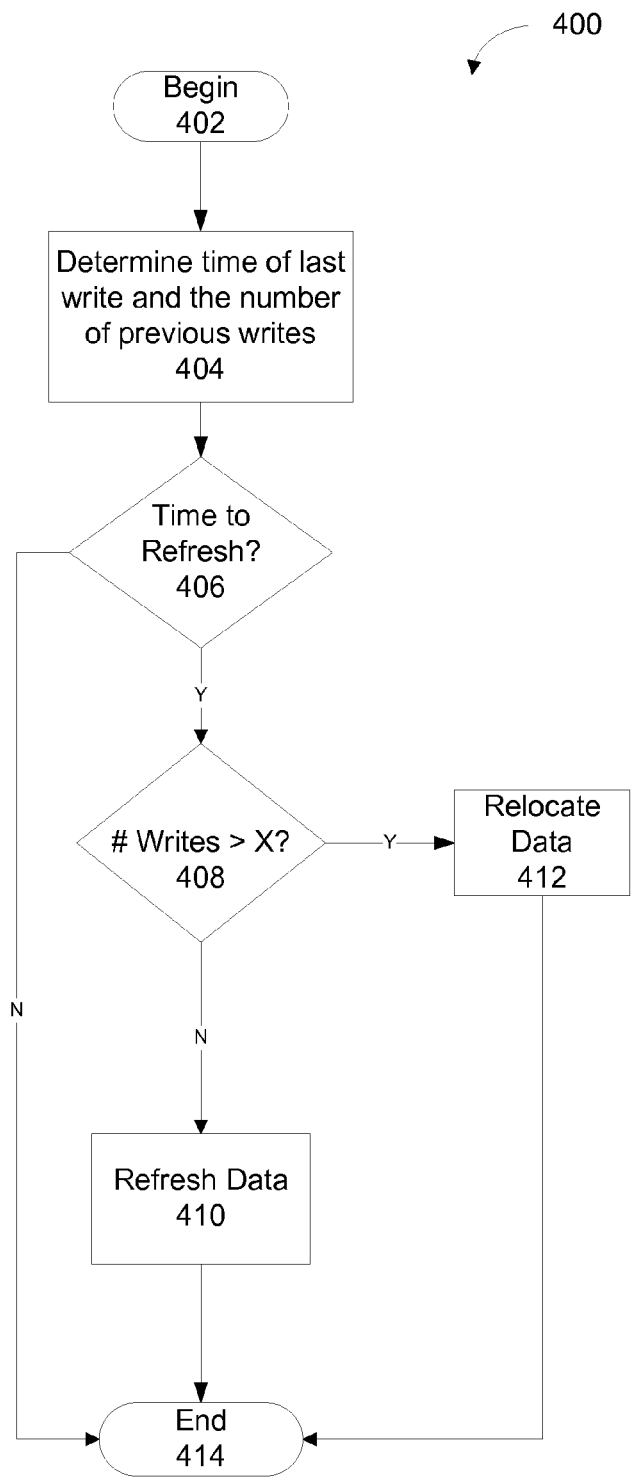
FIG. 4 is a flow diagram illustrating an example method to practice various embodiments of the present invention.

Referring to FIG. 4, a flow diagram 400 of an example method to practice various embodiments of the present invention is illustrated. In various embodiments, unexpected events may arise. For example, a printer may encounter a paper jam or a user may inadvertently open a lid of a portable CD player that is operating. In such instances, the electronic device is expected to retain its state and resume operation when the event has cleared. Therefore, it may be necessary for the data stored in the various retention regions to have a longer life than expected. This may or may not be a problem depending upon the historical use of the electronic device. For example, if the device has experienced a number erase/write cycles beyond its rating, it may retain data for one minute. In the instance where the unexpected event lasts longer than the retention time, e.g. one minute, the printing device or CD player may not be able to resume its operation. Consequently, in various embodiments, the data in various blocks of semi-volatile NAND flash memory may need to be refreshed.

In various embodiments, refreshing data may comprise reading the data and writing the data to the same memory location, or it may comprise moving the data to other selected memory locations. Because refreshing data acts as an additional erase/write cycle which may further reduce the retention time or safe period between refreshes of the block of semi-volatile NAND flash memory, it is advantageous to refresh data only when necessary. For example, when the memory block is in danger of losing its data.

In the illustrated embodiment, the method may begin at block 402 and proceed to block 404. At block 404, the time of the last write to a block of semi-volatile NAND flash memory cells, and the number of previous writes to the block of semi-volatile NAND flash memory cells may be determined.

The method may then proceed to block 406, where it is determined whether the block of semi-volatile NAND flash memory needs to be refreshed. In various embodiments, this determination may be based upon whether a period of time has elapsed since the last erase/write cycle of the data in the block of semi-volatile NAND flash memory. The period of time may be variable depending upon the number of previous erase/write cycles. For example, as discussed above, each erase/write cycle impacts the retention time of the block of semi-volatile NAND flash memory cells. Consequently, as the block of semi-volatile NAND flash memory encounters additional erase/write cycles, the period of time may become shorter and the need to refresh more frequent.

If the block of semi-volatile NAND flash memory needs to be refreshed at block 406 (e.g., the block of semi-volatile NAND flash memory is in danger of losing its data) the method may continue to block 408 where it is determined if the block of semi-volatile NAND flash memory cells has endured a number of erase/write cycles greater than a threshold. In various embodiments, having a number of erase/write cycles greater than a threshold may indicate the block of semi-volatile NAND flash memory cells may no longer efficiently store data. For example, because refreshing data acts as an erase/write cycle, refreshing the data for an extended period of time may create a negative feedback cycle in which each subsequent refresh further reduces the retention time of the block requiring more frequent refreshes which also reduce the retention time of the block. As the block of semi-volatile NAND flash memory approaches complete wear out, refreshing the data may become so frequent that it becomes more efficient to move the data to a block of semi-volatile NAND flash memory having a longer retention time. Therefore, if at block 408 the number of erase/write cycles is greater than a threshold (e.g. the rate of refresh is too frequent), the method may continue to block 412 where the data is relocated to a different block of semi-volatile NAND flash memory. From block 412, the method may progress to block 414 and end. Returning to block 408, if the number of erase/write cycles is not greater than a threshold, the method may refresh the data at block 410 and the method may end at block 414.

In various embodiments, the threshold may be based upon a determined number of erase/write cycles. In other embodiments, the threshold may be based upon a safe period of the block falling below the periodic rate that the refresh process 400 is executed.

Returning to block 406, if it is determined that the block of semi-volatile NAND flash memory does not need to be refreshed, possibly indicating the electronic device is operating normally, the method may continue without refreshing the data and the method may end at block 412.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
receiving data to be stored to a memory;
based on a time period for which the data is expected to be stored in the memory, characterizing the data;
based on characterizing the data, determining whether to use wear-leveling to store the data in the memory;
in response to determining to use wear-leveling to store the data in the memory,
(i) using wear-leveling to select a first memory block of the memory, and
(ii) storing the data in the selected first memory block of the memory; and
in response to determining to not use wear-leveling to store the data in the memory, refraining from using wear-leveling while storing the data in the memory.

2. The method of claim 1, wherein:
characterizing the data further comprises
based on the time period for which the data is expected to be stored in the memory, characterizing the data in one of a plurality of categories; and
determining whether to use wear-leveling to store the data in the memory further comprises
in response to the data being characterized in a first category of the plurality of categories, determining to not use wear-leveling to store the data in the memory, and
in response to the data being characterized in a second category of the plurality of categories, determining to use wear-leveling to store the data in the memory.

3. The method of claim 1, wherein characterizing the data further comprises:
in response to determining that the data is expected to be stored in the memory for more than a first threshold period of time, characterizing the data in a first category of a plurality of categories.

4. The method of claim 3, wherein determining whether to use wear-leveling to store the data in the memory further comprises:
in response to characterizing the data in the first category of the plurality of categories, determining to not use wear-leveling to store the data in the memory.

5. The method of claim 3, wherein characterizing the data further comprises:
in response to determining that the data is expected to be stored in the memory for less than a second threshold period of time, characterizing the data in a second category of the plurality of categories,
wherein the second threshold period of time is less than the first threshold period of time.

6. The method of claim 5, wherein determining whether to use wear-leveling to store the data in the memory further comprises:
in response to characterizing the data in the second category of the plurality of categories, determining to use wear-leveling to store the data in the memory.

7. The method of claim 5, wherein characterizing the data further comprises:
in response to determining that the data is expected to be stored in the memory for (i) more than the second threshold period of time and (ii) less than the first threshold period of time, characterizing the data in a third category of the plurality of categories.

8. The method of claim 1, wherein the memory is partitioned in a plurality of regions, and wherein the method further comprises:
in response to determining to not use wear-leveling to store the data in the memory, storing the data in a second memory block of a first region of the plurality of regions of the memory, and
wherein using wear-leveling further comprises in response to determining to use wear-leveling to store the data in the memory, using wear-leveling to select the first memory block from a second region of the plurality of regions of the memory.

9. The method of claim 1, further comprising:
partitioning the memory into a plurality of regions; and
based on characterizing the data, selecting a region of the plurality of regions of the memory to store the data.

10. The method of claim 9, wherein:
a first region of the plurality of regions of the memory is configured to store data having a first expected storage duration; and
a second region of the plurality of regions of the memory is configured to store data having a second expected storage duration.

11. The method of claim 1, wherein the memory is a non-volatile memory.

12. The method of claim 1, wherein the memory is a NAND flash memory.

13. A memory controller configured to control access to a memory, the memory controller configured to:
receive data to be stored to the memory;
based on a time period for which the data is expected to be stored in the memory, characterize the data;
based on characterizing the data, determine whether to use wear-leveling to store the data in the memory;
in response to determining to use wear-leveling to store the data in the memory,
(i) use wear-leveling to select a first memory block of the memory, and
(ii) store the data in the selected first memory block of the memory; and
in response to determining to not use wear-leveling to store the data in the memory, refrain from using wear-leveling while storing the data in the memory.

14. The memory controller of claim 13, wherein:
the memory controller is configured to characterize the data by
based on the time period for which the data is expected to be stored in the memory, characterizing the data in one of a plurality of categories; and
the memory controller is configured to determine whether to use wear-leveling to store the data in the memory by
in response to the data being characterized in a first category of the plurality of categories, determining to not use wear-leveling to store the data in the memory, and
in response to the data being characterized in a second category of the plurality of categories, determining to use wear-leveling to store the data in the memory.

15. The memory controller of claim 13, wherein the memory controller is configured to characterize the data by:
in response to determining that the data is expected to be stored in the memory for more than a first threshold period of time, characterizing the data in a first category of a plurality of categories; and
in response to determining that the data is expected to be stored in the memory for less than a second threshold period of time, characterizing the data in a second category of the plurality of categories,
wherein the second threshold period of time is less than the first threshold period of time.

16. The memory controller method of claim 15, wherein the memory controller is configured to determine whether to use wear-leveling to store the data in the memory by:
in response to characterizing the data in the first category of the plurality of categories, determining to not use wear-leveling to store the data in the memory; and
in response to characterizing the data in the second category of the plurality of categories, determining to use wear-leveling to store the data in the memory.

17. The memory controller of claim 15, wherein the memory controller is further configured to characterize the data by:
in response to determining that the data is expected to be stored in the memory for (i) more than the second threshold period of time and (ii) less than the first threshold period of time, characterizing the data in a third category of the plurality of categories.

18. The memory controller of claim 13, wherein the memory controller is further configured to:
partition the memory into a plurality of regions; and
based on characterizing the data, select a region of the plurality of regions of the memory to store the data.

19. The memory controller of claim 13, wherein the memory is a non-volatile memory.

20. The memory controller of claim 13, wherein the memory is a NAND flash memory.

* * * * *